(12) United States Patent
Mori

(10) Patent No.: US 11,056,207 B2
(45) Date of Patent: Jul. 6, 2021

(54) EFUSE CIRCUIT AND OPERATION METHOD THEREOF

(71) Applicant: Winbond Electronics Corp., Taichung (TW)

(72) Inventor: Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/742,925

(22) Filed: Jan. 15, 2020

(65) Prior Publication Data

US 2020/0265905 A1    Aug. 20, 2020

Related U.S. Application Data

(60) Provisional application No. 62/807,721, filed on Feb. 19, 2019.

(51) Int. Cl.
| | |
|---|---|
| *G11C 17/00* | (2006.01) |
| *G11C 17/16* | (2006.01) |
| *G11C 17/18* | (2006.01) |

(52) U.S. Cl.
CPC .............. *G11C 17/16* (2013.01); *G11C 17/18* (2013.01)

(58) Field of Classification Search
CPC ................................. G11C 17/16; G11C 17/18
See application file for complete search history.

(56) References Cited

U.S. PATENT DOCUMENTS

| 6,430,101 | B1 * | 8/2002 | Toda ...................... G11C 17/16 365/200 |
| 7,551,470 | B2 * | 6/2009 | Erickson ................ G11C 5/005 365/225.7 |
| 9,666,308 | B2 | 5/2017 | Noh | |
| 2008/0024196 | A1 | 1/2008 | Marshall | |
| 2011/0002186 | A1 * | 1/2011 | Buonpane .............. G11C 17/18 365/225.7 |
| 2012/0213014 | A1 | 8/2012 | Koyashiki et al. | |

FOREIGN PATENT DOCUMENTS

| CN | 1993770 | 7/2007 |
| TW | 201624493 | 7/2016 |

OTHER PUBLICATIONS

"Office Action of Taiwan Counterpart Application", dated May 6, 2020, p. 1-p. 6.

* cited by examiner

*Primary Examiner* — Pho M Luu
(74) *Attorney, Agent, or Firm* — JCIPRNET

(57) ABSTRACT

An efuse circuit adapted for a memory device is provided. The efuse circuit includes a plurality of efuse sets and a control circuit. Each of the plurality of efuse sets includes a plurality of efuses. When a power is turned on, the control circuit detects each of the plurality of efuse sets to generate a detection signal. The control circuit determines whether the efuses of each of the efuse sets are burned according to the detection signal to determine whether to perform a burn operation on the plurality of efuses. When the control circuit determines that at least one of the plurality of efuses is a burned efuse according to the detection signal, the control circuit latches a write data of at least one burned efuse and disables an overwrite operation on the efuse set to which the at least one burned efuse belongs.

20 Claims, 11 Drawing Sheets

EFUSE CIRCUIT AND OPERATION METHOD THEREOF

CROSS-REFERENCE TO RELATED APPLICATION

This application claims the priority benefit of U.S. provisional application No. 62/807,721, filed on Feb. 19, 2019. The entirety of the above-mentioned patent application is hereby incorporated by reference herein and made a part of this specification.

TECHNICAL FIELD

The invention relates to an efuse circuit adapted for a memory device and an operation method thereof, and more particularly, to an efuse circuit without a use bit and an operation method thereof.

BACKGROUND

Electronic fuses (efuses) are widely used to overcome the process defect of memory device. Defective memory cells may be replaced by burning the efuses by applying a large current to the efuses.

In the conventional art, the use bit is used to check whether an efuse set to which the efuses belong has a burned efuse, and yet the use bit will increase chip area overall. On the other hand, in order to wait for a burn voltage to recover to a sufficient voltage value, a wait time of a burn clock signal is extended in the conventional art, but results in processing speed (throughput) degradation of the efuses.

Further, because temporarily stored data is updated only when power on and off in the conventional art, an overwrite operation performed on the efuse set having the burned efuse between power on and off will lead to reliability degradation of a burn operation performed on the efuses. In addition, when multiple efuses are to be burned in a short time and one of the efuses is burned first, as a large current will flow into the efuse that was burned first, burn voltages of the other efuses will be pulled down to cause reliability degradation of the burn operation for the other efuses.

SUMMARY

The invention provides an efuse circuit band an operation thereof, which are used to determine whether the efuse is burned without the use bit to reduce chip area and improve processing speed and reliability of the burn operation.

An embodiment of the invention provides an efuse circuit adapted for a memory device. The efuse circuit includes a plurality of efuse sets and a control circuit. Each efuse set includes a plurality of efuses. When a power is turned on, the control circuit detects each efuse set to generate a detection signal. The control circuit determines whether the efuses of each efuse set are burned according to the detection signal to determine whether to perform a burn operation on the efuses. When determining that at least one efuse of the plurality of efuses is a burned efuse according to the detection signal, the control circuit disables an overwrite operation on the efuse set to which the at least one burned efuse belongs. In addition, when write data of the efuses are latched and a re-burn request is present during a period in which the power is turned on, the detection signal is updated according to the write data of each efuse set, and whether each efuse of the efuse sets is burned is determined according to the detection signal so as to determine whether to perform the burn operation on the efuses.

An embodiment of the invention provides an operation method of an efuse circuit, and the efuse circuit is adapted for a memory device. The efuse circuit includes a plurality of efuse sets and a control circuit. Each efuse set has a plurality of efuses. The operation method includes but not limited to: when a power is turned on, detecting each efuse set to generate a detection signal. Whether the efuses of each of the efuse sets are burned is determined according to the detection signal. Whether to perform a burn operation on the plurality of efuses is determined. When determining that at least one efuse of the plurality of efuses is a burned efuse according to the detection signal, an overwrite operation on the efuse set to which the at least one burned efuse belongs is disabled.

Based on the above, according to the embodiments of the invention, the efuse circuit and the operation method thereof are used to determine whether the efuse is burned without the use bit. When determining that at least one efuse in the efuses is the burned efuse, the control circuit disables the overwrite operation on the efuse set to which the burned efuse belongs, so as to reduce chip area and improve processing speed and reliability of the burn operation.

To make the aforementioned more comprehensible, several embodiments accompanied with drawings are described in detail as follows.

DESCRIPTION OF THE EMBODIMENTS

Figure 1:
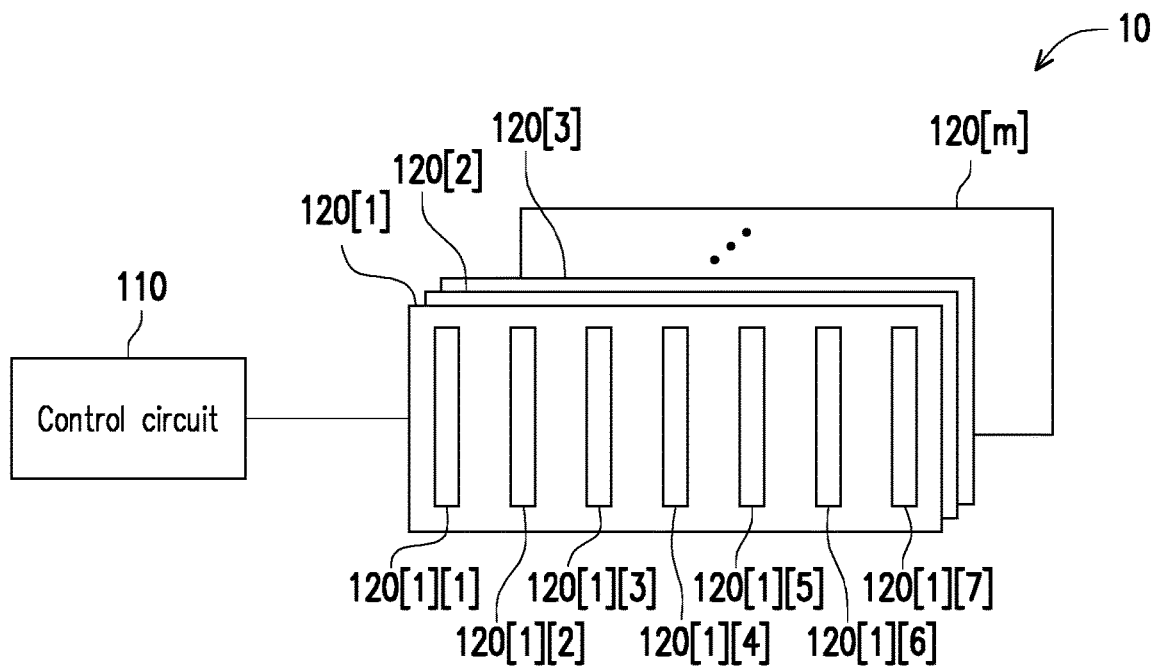
FIG. 1 is a schematic diagram of an efuse circuit in an embodiment of the invention.

Referring to FIG. 1, an efuse circuit 10 includes a control circuit 110 and efuse sets 120[1] to 120[m]. In an embodiment, the efuse circuit 10 has m efuse sets, and m is a positive integer greater than 1. Each of the efuse sets 120[1] to 120[*m*] includes a plurality of efuses. For instance, the efuse set 120[1] has efuses 120[1][1] to 120[1][7]. The control circuit 110 is coupled to the efuse sets 120[1] to 120[*m*]. The efuse circuit 10 replace defective memory cells in a memory device (not illustrated) by applying a large current to the efuses to burn the efuses.

Figure 2:
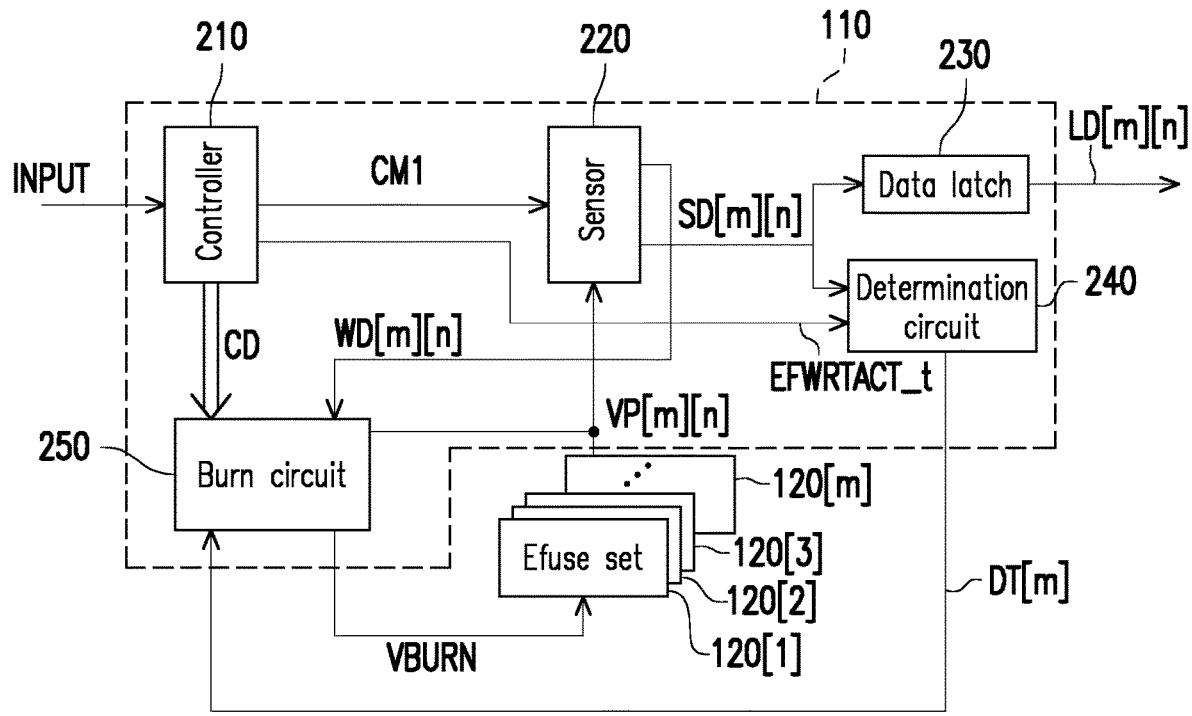
FIG. 2 is a circuit block diagram of an efuse circuit in an embodiment of the invention.

Referring to FIG. 1 and FIG. 2, when a power is turned on, the control circuit 110 may detect the efuse set 120[*m*] to generate a detection signal DT[m]. The control circuit 110 determines whether the efuses 120[*m*][1] to 120[*m*][*n*] of the efuse set 120[*m*] are burned according to the detection signal DT[m] so as to determine whether to perform a burn operation on the efuses 120[*m*][1] to 120[*m*][*n*]. In detail, the control circuit 110 detects fuse voltages VP[m][1] to VP[m][n] at first terminal (high potential terminals) of the efuses 120[*m*][1] to 120[*m*][*n*], and compares the fuse voltages VP[m][1] to VP[m][n] with a voltage value of a first threshold voltage to generate the detection signal DT[m]. Then, the control circuit 110 determines whether the efuses 120[*m*][1] to 120[*m*][*n*] are a burned efuse according to the detection signal DT[m]. The fuse voltage VP[m][n] represents the voltage at the first terminal (high potential terminal) of the n-th efuse 120[*m*][*n*] of the m-th efuse set 120[*m*]. The first threshold voltage may be determined based on design requirements. The detection signal DT[m] may be, for example, a set of logic signals used to represent a comparison result between voltage values of the fuse voltages VP[m][1] to VP[m][n] and the first threshold voltage. Next, when the control circuit 110 determines that at least one efuse of the efuses is the burned efuse according to the detection signal DT[m], the control circuit 110 disables an overwrite operation on the efuse set to which the at least one burned efuse belongs.

For instance, when the power is turned on, the control circuit 110 may detect the fuse voltages at the first terminals (high potential terminals) of the efuses 120[1][1] to 120[1][7] in the efuse set 120[1], and compare the fuse voltages VP[1][1] to VP[1][7] with the first threshold voltage to generate the detection signal DT[1]. Then, the control circuit 110 determines whether the efuses 120[1][1] to 120[1][7] in the efuse set 120[1] are the burned efuse according to the detection signal DT[1]. When determining that the efuse 120[1][2] is the burned efuse according to the detection signal DT[1], the control circuit 110 disables the overwrite operation on the efuse set 120[1] to which the efuse 120[1][2] belongs, so as to prevent the efuse set 120[1] having the burned efuse 120[1][2] from the overwrite operation, thereby preventing the burn operation from reliability degradation.

Further, the implementation regarding how the control circuit 110 compares the fuse voltage VP[m][n] with the first threshold voltage to generate the detection signal DT[m] may depend on actual design requirements. For instance, if the fuse voltage VP[1][2] is less than the first threshold voltage, the control circuit 110 may determine that the efuse 120[1][2] of the efuse set 120[1] is a not-burned efuse. When the efuse VP[1][2] is greater than the first threshold voltage, the control circuit 110 may determine that the efuse 120[1][2] of the efuse set 120[1] is the burned efuse.

Referring to FIG. 2, the efuse circuit 10 includes the control circuit 110 and the efuse sets 120[1] to 120[*m*]. In an embodiment, the control circuit 110 includes a controller 210, a sensor 220, a data latch 230, a determination circuit 240 and a burn circuit 250. In an embodiment, the controller 210 receives an input signal INPUT provided by a control logic circuit (not illustrated) in the memory device to generate a first control signal CM1 and control data CD. In this embodiment, the controller 210 is configured to provide the first control signal CM1 and the control data CD for controlling operations of the sensor 220 and the burn circuit 250, and a structure of the controller 210 is not particularly limited by the invention.

The sensor 220 is coupled between the controller 210 and the first terminal of the efuse 120[*m*][*n*] of the efuse set 120[*m*], and the voltage at the first terminal of the efuse 120[*m*][*n*] is the fuse voltage VP[m][n]. The sensor 220 detects the fuse voltage VP[m][n] at the first terminal of the efuse 120[*m*][*n*] of the efuse set 120[*m*] according to the first control signal CM1 to generate sense data SD[m][n]. For instance, the sensor 220 detects the fuse voltage VP[1][2] at the first terminal of the efuse 120[1][2] of the efuse set 120[1] according to the first control signal CM1 to generate the sense data SD[1][2].

The data latch 230 is coupled to the sensor 220. The data latch 230 latches the sense data SD[m][n] to generate latched data LD[m][n] and outputs the latched data LD[m][n] to the control logic circuit (not illustrated) of the memory device. The data latch 230 may be a conventional latch, and a structure of the data latch 230 is not particularly limited by the invention.

The determination circuit 240 is coupled to the sensor 220, and the determination circuit 240 determines whether the at least one efuse in the efuses 120[*m*][1] to 120[*m*][*n*] of the efuse set 120[*m*] is the burned efuse according to the sense data SD[m][n] to generate the detection signal DT[m]. For instance, according to the sense data SD[1][1] to SD[1][7], the determination circuit 240 determines that the efuse 120[1][2] in the efuse set 120[1] is the burned efuse and the other efuses 120[1][1] and 120[1][3] to 120[1][7] are the not-burned efuse, and accordingly generates the detection signal DT[1].

The burn circuit 250 is coupled to the controller 210, the efuses, the sensor 220 and the determination circuit 240. The burn circuit 250 outputs the fuse voltage VP[m][n] to the first terminals of the efuses according to the control data CD, write data WD[m][n] and the detection signal DT[m], and outputs a burn voltage VBURN to second terminals (low potential terminals) of the efuses. For instance, according to the received control data CD, the write data WD[1][2] and the detection signal DT[1], the burn circuit 250 may output the fuse voltage VP[1][2] to the first terminal of the efuse 120[1][2] of the efuse set 120[1] and output the burn voltage VBURN to the second voltage of the efuse 120[1][2]. Implementation details of the sensor 220, the determination circuit 240 and the burn circuit 250 will be described in detail below.

Figure 3:
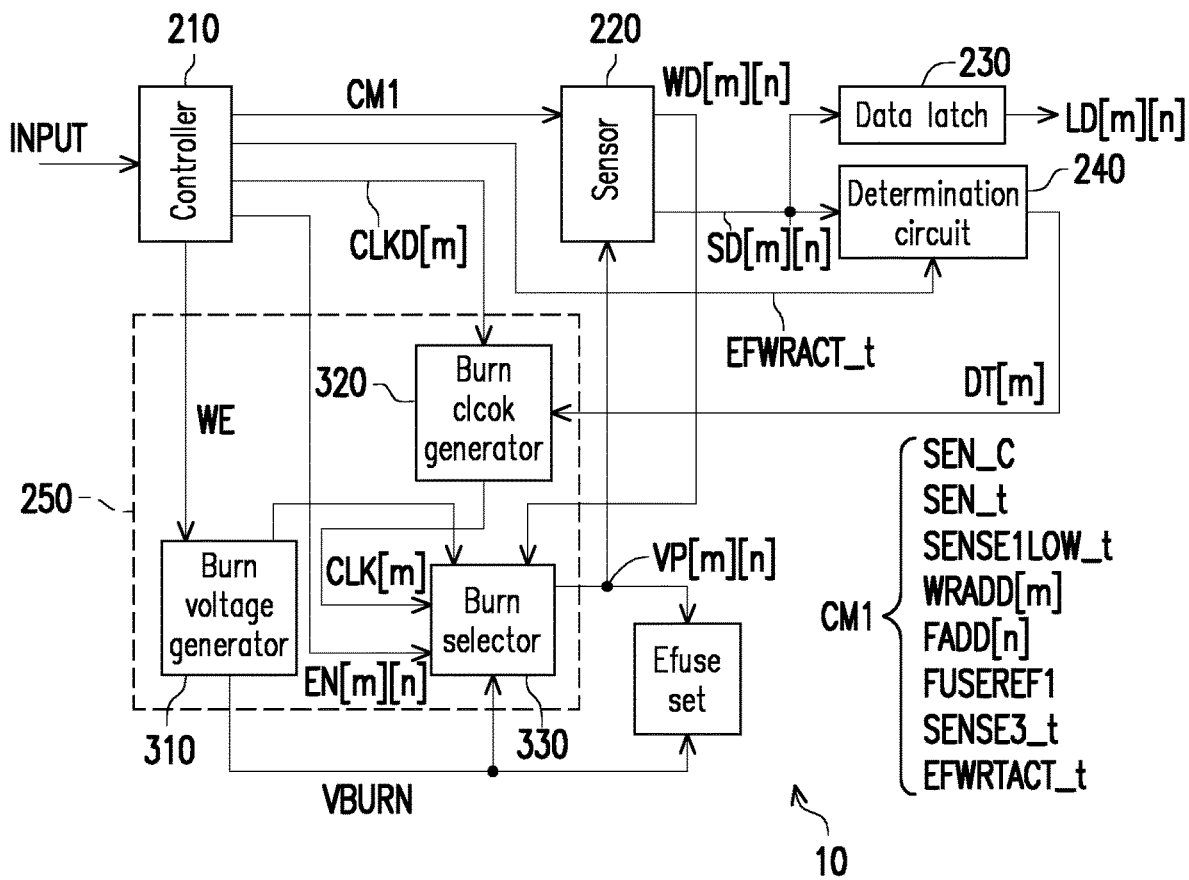
FIG. 3 is a circuit block diagram of an efuse circuit including internal circuits of a burn circuit in an embodiment of the invention.

Referring to FIG. 3, the burn circuit 250 in the efuse circuit 10 includes a burn voltage generator 310, a burn clock generator 320 and a burn selector 330. The burn voltage generator 310 is coupled between the controller 210 and the efuse set 120[*m*]. The burn voltage generator 310 generates a burn enable signal BURNEN and the burn voltage VBURN according to a write enable signal WE in the control data CD, and outputs the burn voltage VBURN to the second terminals of the efuse 120[*m*][*n*] of the efuse set 120[*m*].

The burn clock generator 320 is coupled to the controller 210 and the determination circuit 240. The burn clock generator 320 receives the detection signal DT[m] and clock data CLKD[m] for the efuse set 120[*m*] in the control data CD, and generates a clock signal CLK[m] (CLK[m]_t) for the efuse set 120[*m*] according to the detection signal DT[m] and the clock data CLKD[m]. For instance, the burn clock generator 320 receives the detection signal DT[1] generated for the efuse set 120[1] and the clock data CLKD[1] for the efuse set 120[1] in the control data CD to generate the clock signal CLK[1] for the efuse set 120[1].

The burn selector 330 is coupled to the controller 210, the sensor 220, the burn voltage generator 310 and the burn clock generator 320. The burn selector 330 receives the write data WD[m][n] from the sensor 220, receives the burn enable signal BURNEN and the burn voltage VBURN from the burn voltage generator 310, and receives the clock signal CLK[m] from the burn clock generator 320. The burn selector 330 generates the fuse voltage VP[m][n] to the first terminal of the efuse 120[$m$][$n$] of the efuse set 120[$m$] according to an enable signal EN[m][n] in the control data CD, the write data WD[m][n], the burn enable signal BURNEN, the burn voltage VBURN and the clock signal CLK[m], and performs the burn operation on the efuse [m][n] requiring the burn operation according to the fuse voltage VP[m][n]. In this embodiment, when the fuse voltage VP[m][n] is greater than a second threshold voltage, the burn operation is performed on the efuse 120[$m$][$n$].

Figure 4:
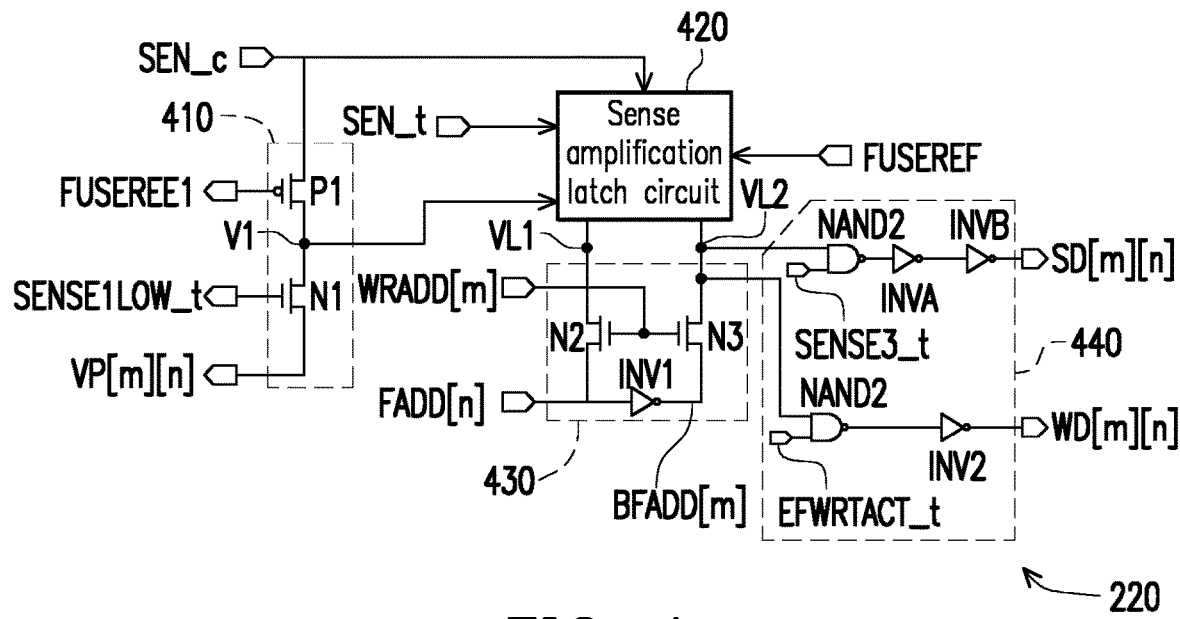
FIG. 4 is a circuit diagram of a sensor in an embodiment of the invention.

Referring to FIG. 4, the sensor 220 includes a first switch circuit 410, a sense amplification latch circuit 420, a second switch circuit 430 and a logic circuit 440. In this embodiment, the first switch circuit 410 is coupled between the controller 210 and the first terminals of the efuses 120[$m$][$n$]. The first switch circuit 410 receives a first enable signal SEN_c, a first switch signal FUSEREF1, a second switch signal SENSE1LOW and the fuse voltage VP[m][n] to generate a first voltage V1. The sense amplification latch circuit 420 is coupled to the first switch circuit 410, and receives the first enable signal SEN_c, a second enable signal SEN_t, a third enable signal SENSE3_$t$, the first voltage V1 and a latch voltage VL1 to generate a latch voltage VL2. The second switch circuit 430 is coupled to the sense amplification latch circuit 420. The second switch circuit 430 receives a second control signal WRADD[m] and efuse address data FADD[m] to generate the latch voltage VL1 and the latch voltage VL2. The logic circuit 440 is coupled to the sense amplification latch circuit 420 and the second switch circuit 430. The logic circuit 440 receives the latch voltage VL2 to generate the sense data SD[m][n] and the write data WD[m][n].

The first switch circuit 410 includes a transistor P1 and a transistor N1. A first terminal of the transistor P1 receives the first enable signal SEN_c; a control terminal of the transistor P1 is coupled to the first switch signal FUSEREF1; and a voltage at a second terminal of the transistor P1 is the first voltage V1. A first terminal of the transistor N1 is coupled to the second terminal of the transistor P1; a control terminal of the transistor N1 receives the second switch signal SENSE1LOW; and a second terminal of the transistor N1 receives the fuse voltage VP[m][n]. The first switch circuit 410 controls the transistor P1 and the transistor N1 by the first switch signal FUSEREF1 and the second switch signal SENSE1LOW to read out the fuse voltage VP[m][n] as the first voltage V1, and provides the first voltage V1 to the sense amplification latch circuit 420. The operation of the sense amplification latch circuit 420 will be described later.

The second witch circuit 430 includes a transistor N2, a transistor N3 and an inverse gate INV1. A first terminal of the transistor N2 is coupled to the sense amplification latch circuit 420; a voltage at the first terminal of the transistor N2 is the latch voltage VL1; a control terminal of the transistor N2 receives the second control signal WRADD[m]; and a second terminal of the transistor N2 receives the efuse address data FADD[m]. A first terminal of the transistor N3 is coupled to the sense amplification latch circuit 420; a voltage at the first terminal of the transistor N3 is the latch voltage VL2; and a control terminal of the transistor N3 receives the second control signal WRADD[m]. The inverse gate INV1 is coupled between the second terminal of the transistor N2 and the second terminal of the transistor N3, and the inverse gate INV1 receives the efuse address data FADD[m] to generate inversed efuse address data BFADD[m] to the second terminal of the transistor N3.

The logic circuit 440 includes an NAND gate NAND1, an NAND gate NSND2 and an inverse gate INV2. The NAND gate NAND1 is coupled to the first terminal of the transistor N3 and the sense amplification latch circuit 420, and an input terminal of the NAND gate NAND1 receives the latch voltage VL2 and the third enable signal SENSE3_$t$ to perform NAND logical operation and generate the sense data SD[m][n] through buffering performed by an inverse gate INVA and an inverse gate INVB. The NAND gate NAND2 is coupled to the sense amplification latch circuit 420 and the first terminal of the transistor N3, and configured to receive the latch voltage VL2 and a first write enable signal EFWRTACT_$t$ to generate inversed write data BWD[m][n]. The inverse gate INV2 is coupled to the NAND gate NAND2, and the inverse gate INV2 receives the inversed write data BWD[m][n] to generate the write data WD[m][n].

Referring to FIG. 4, when the power is turned on, the first enable signal SEN_c and the second enable signal SEN_t in the control signal CM1 are at high logic level to enable the sense amplification latch circuit 420. By controlling the transistor P1 and the transistor N1 through the first switch signal FUSEREF1 and the second switch signal ENSELOW, the fuse voltage VP[m][n] at the first terminal of the efuse 120[$m$][$n$] may be read out as the first voltage V1, and the first voltage V1 may be amplified and latched by the sense amplification latch circuit 420. Here, the power of the sense amplification latch circuit 420a, the inverse gate INV1, the inverse gate 2, the inverse gate A, the inverse gate B, the NAND gate NAND1 and the NAND gate NAND2 is a power voltage VINT and grounded to a ground voltage VSS (not illustrated). The power voltage VINT is a voltage greater than the first voltage V1, and a size of the power voltage VINT is determined based on design requirements. Next, the sensor 220 outputs the sense data SD[m][n] to the determination circuit 240. The sensor 220 has two roles, and one is to sense the fuse voltage VP[m][n] of the efuse 120[$m$][$n$] and latch the first voltage V1 to control a timing for outputting the sensing data SD[m][n]. The other one is to latch the efuse address data FADD[m] to control a timing for transmitting the write data WDD[m][n] to the burn circuit 250. When the second control signal WRADD[m]_t is at high logic level, the transistor N2 and the transistor N3 are turned on so that the efuse address data FADD[m] is provided to the sense amplification latch circuit 420 and the efuse address data FADD[m] is latched after the efuse 120[$m$][$n$] is burned. According to the above, the overwrite operation after the efuse 120[$m$][$n$] is burned may be disabled.

Figure 5A:
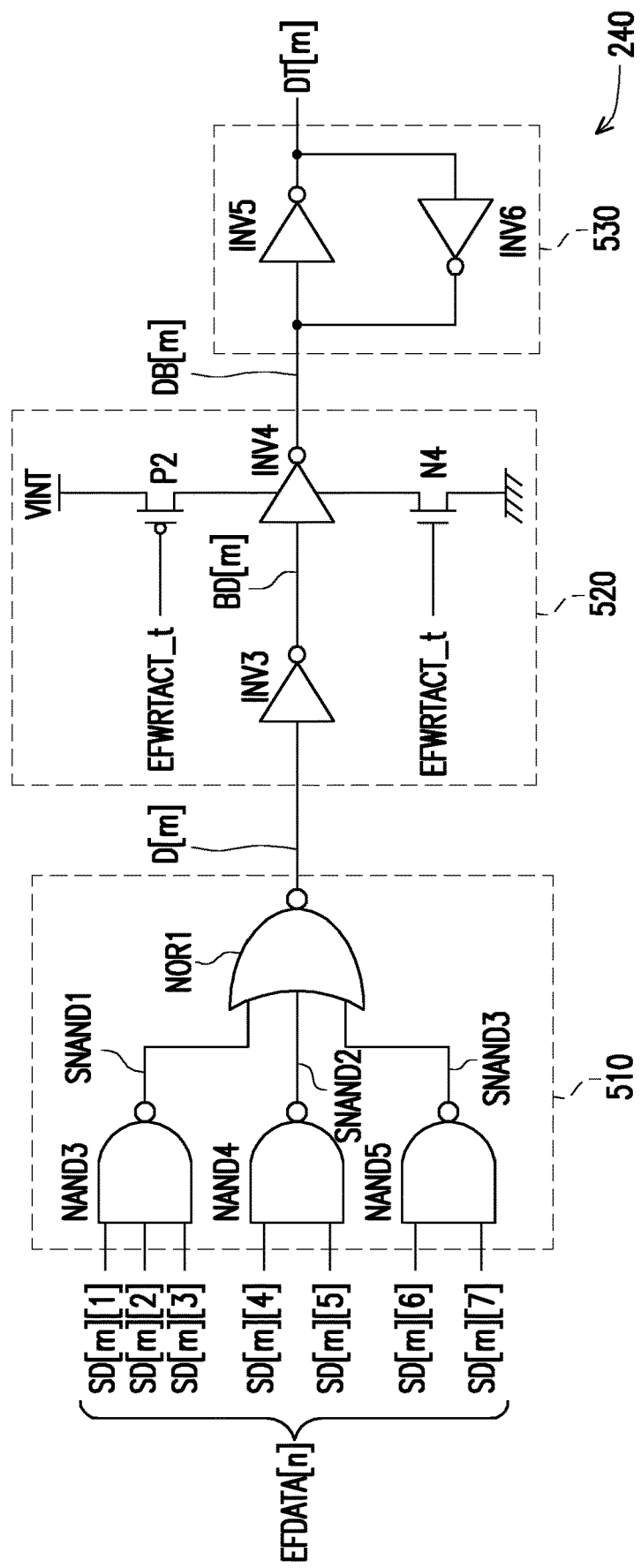
FIG. 5A is a circuit diagram of a determination circuit in an embodiment of the invention.

Referring to FIG. 5A, the determination circuit 240 includes a logic determination circuit 510, a buffer circuit 520 and a latch 530. The logic determination circuit 510 is coupled to the sensor 220, and configured to receive sense data SD[m][1] to SD[m][n] and determine whether the at least one efuse in the efuses 120[$m$][1] to 120[$m$][n] is the burned efuse according to the sense data SD[m][1] to SD[m][n] to generate the determination signal D[m]. The buffer circuit 520 is coupled to the logic determination circuit 510, and the buffer circuit 520 receives the determination circuit signal D[m] and generates a buffered determination signal DB[m]. The latch 530 is coupled to the buffer circuit 520, and the latch 530 receives the buffered determination signal DB[m] from the buffer circuit 520 which are then latched to generate the determination signal T[m]. Operations of the determination circuit 240 will be described later.

The logic determination circuit 510 includes an NAND gate NAND3, an NAND gate NAND4, an NAND gate NAND5 and an NOR gate NOR1. The NAND gate NAND3 receives sub sense data SD[m][1] to SD[m][3] in the sense data SD[m][1] to SD[m][n] and performs NAND logic operation to generate an NAND signal SNAND1. The NAND gate NAND4 receives sub sense data SD[m][4] to SD[m][5] in the sense data SD[m][1] to SD[m][n] and performs NAND logic operation to generate an NAND signal SNAND2. The NAND gate NAND5 receives sub sense data SD[m][6] to SD[m][7] in the sense data SD[m][1] to SD[m][n] and performs NAND logic operation to generate an NAND signal SNAND3. An output terminal of the NOR gate NOR1 is coupled to output terminals of the NAND gate NAND1, the NAND gate NAND2 and the NAND gate NAND3. The NOR gate NOR1 receives the NAND signal SNAND1, the NAND signal SNAND2 and the NAND signal SNAND3, and performs NAND logic operation to generate the determination signal D[m].

The buffer circuit 520 includes an inverse gate INV3, an inverse gate INV4, a transistor P2 and a transistor P4. The inverse gate INV3 is coupled to the logic determination circuit 510, and the inverse gate INV3 receives the determination signal D[m] to generate an inversed determination signal BD[m]. The inverse gate INV4 is coupled to the inverse gate INV3, and the inverse gate INV4 receives the inversed determination signal BD[m] to generate the buffered determination signal DB[m]. The transistor P2 is coupled to the inverse gate INV4; a first terminal of the transistor P2 receives the power voltage VINT; a control terminal of the transistor P2 receives the first write enable signal EFWRTACT_t; and a second terminal of the transistor P2 is coupled to a power terminal of the inverse gate INV4. The transistor N4 is coupled to the inverse gate INV4; a first terminal of the transistor N4 is coupled to a ground terminal of the inverse gate INV4; a control terminal of the transistor N2 receives a second write enable signal EFWRTACT_c; and a second terminal of the transistor N4 is coupled to the ground voltage VSS.

Referring to FIG. 2 and FIG. 5A, the determination circuit 240 receives the sense data SD[m][1] to SD[m][n] from the sensor 220, and the logic determination circuit 510 in the determination circuit 240 performs logic operation on the SD[m][1] to SD[m][n]. When determining that the at least one efuse in the efuses 120[m][1] to 120[m][n] is the burned efuse according to the sense data SD[m][1] to SD[m][n], the logic determination circuit 510 generates the determination signal D[m] having low logic level. Next, the buffer circuit 520 buffers the determination signal D[m] having low logic level to generate the buffered determination signal DB[m] having low logic level, and the latch 530 latches the buffered determination signal DB[m] having low logic level to generate the detection signal DT[m] having high logic level. On the other hand, when determining that no efuse in the efuses 120[m][1] to 120[m][n] is the burned efuse according to the sense data SD[m][1] to SD[m][n], the logic determination circuit 510 generates the determination signal D[m] having high logic level. Next, the buffer circuit 520 buffers the determination signal D[m] having high logic level to generate the buffered determination signal DB[m] having high logic level, and the latch 530 latches the buffered determination signal DB[m] having high logic level to generate the detection signal DT[m] having low logic level. The logic circuit 530 includes an inverse gate INN5 and an inverse gate INV6.

Figure 5B:
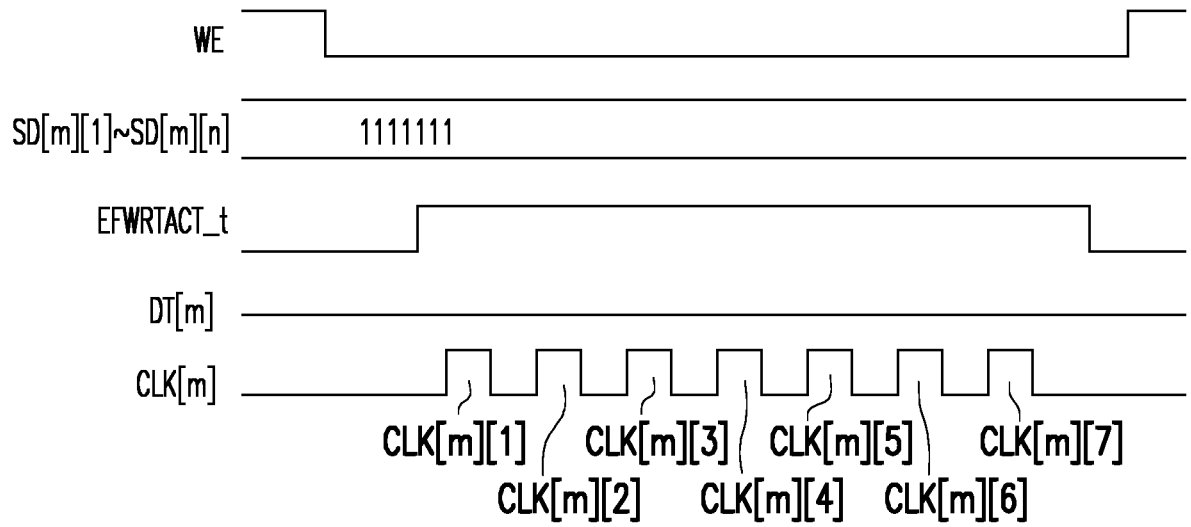
FIG. 5B is a timing diagram of the determination circuit receiving sense data of 1111111 in an embodiment of the invention.
Figure 5C:
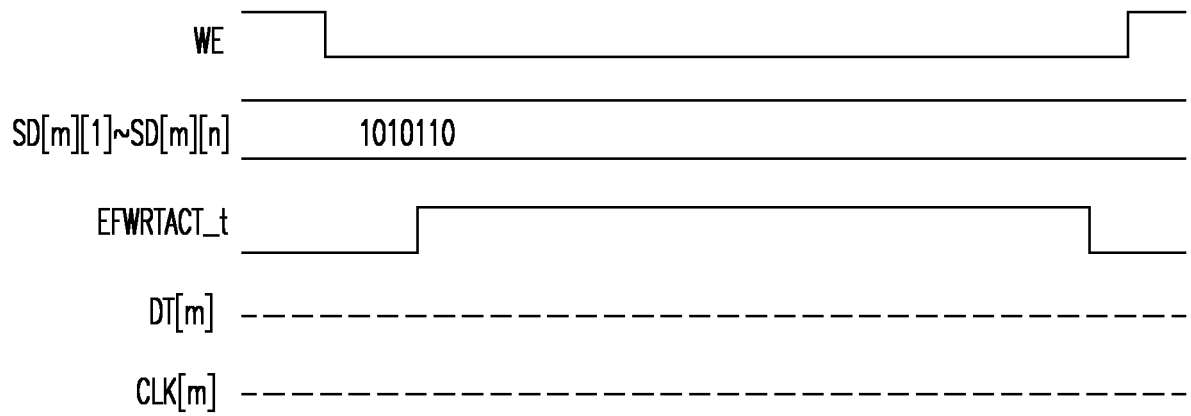
FIG. 5C is a timing diagram of the determination circuit receiving sense data of 1010110 in an embodiment of the invention.

Referring to FIG. 1, FIG. 3, FIG. 5A, FIG. 5B and FIG. 5C, when the control circuit 110 is to perform the burn operation on the efuse 120[m][n], the controller 210 provides the enable signal WE having low logic level to the burn voltage generator 310 in the burn circuit 250 to enable the burn voltage generator 310. Next, the controller 210 provides the first write enable signal EFWRTACT_t having high logic level to the determination circuit 240. Referring to FIG. 5B, when the sense data SD[m][1] to SD[m][n] are 1111111, the determination circuit 240 generates the detection signal DT[m] having low logic level. Accordingly, the burn clock generator 320 generates the clock signal CLK[m] having pulse signals CLK[m][1] to CLK[m][7] corresponding to the efuses 120[m][1] to 120[m][n] according to the detection signal DT[m] having low logic level such that the burn operation is performed on the efuses 120[m][1] to 120[m][n]. Referring to FIG. 5C, when the sense data SD[m][1] to SD[m][n] are 1010110, the determination circuit 240 generates the detection signal DT[m] having high logic level. Accordingly, the burn clock generator 320 generates the clock signal DT[m] having low logic level according to the detection signal DT[m] having high logic level such that the burn operation is not performed on the efuses 120[m][1] to 120[m][n]. In this embodiment, the m-th efuse set has 7 efuses; however, this is only an example, and the invention does not limit the number of n.

Figure 6:
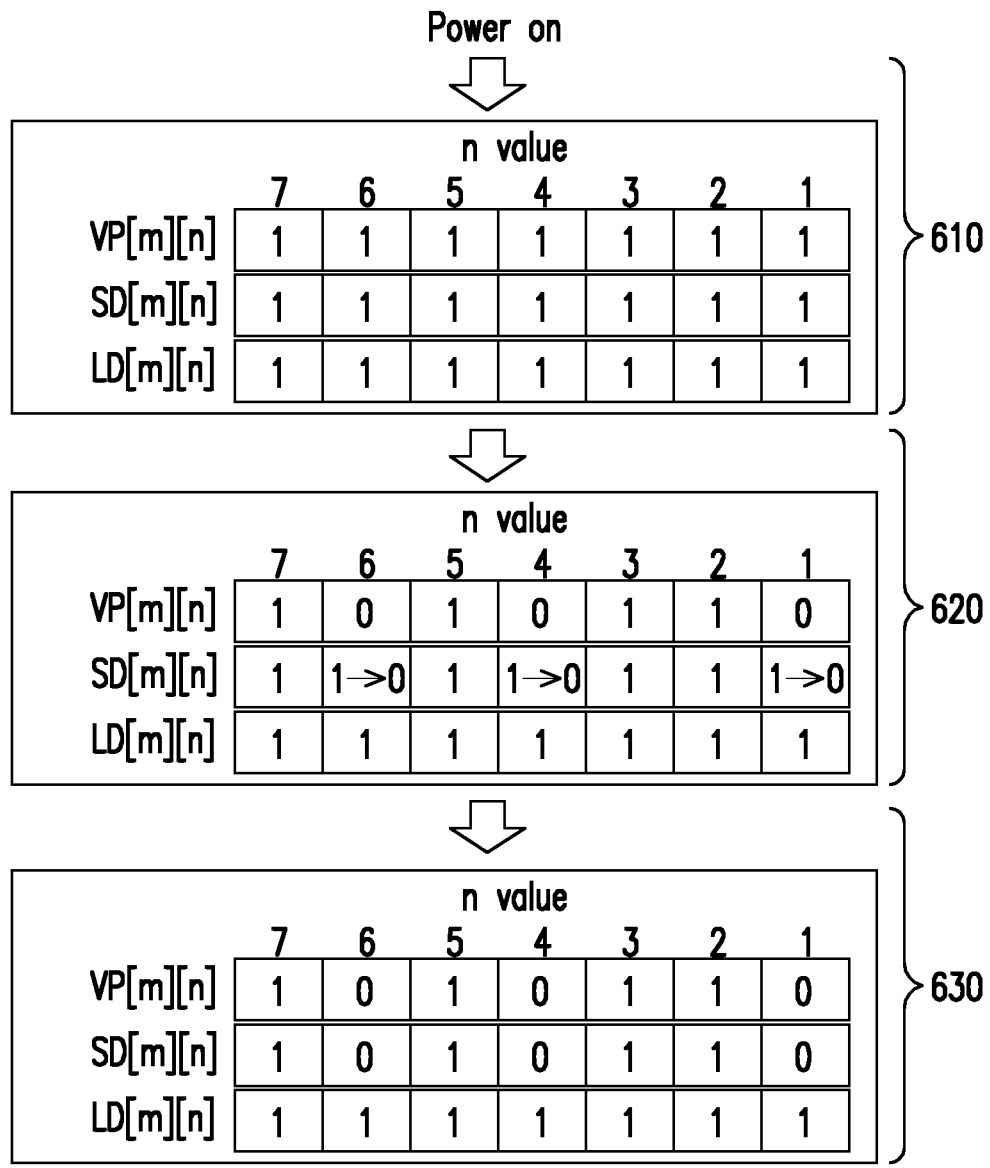
FIG. 6 is a transition diagram of efuse related values in an embodiment of the invention.

Referring to FIG. 6, in this embodiment, when the power is turned on, the write data WD[m][1] to WD[m][n] are input twice to a specific efuse 120[m], for example. Here, the write data WD[m][1] to WD[m][n] of the first time are 1010110, and the write data WD[m][1] to WD[m][n] of the second time are 1000110. Here, a cut-off state of the efuse is represented by the fuse voltage VP when the efuse is sensed; the fuse voltage VP is at high logic level when the efuse is not cut off; and the fuse voltage VP is at low logic level when the efuse is cut off. At a timing 610, the power is turned on, the initial fuse voltages VP[m][1] to VP[m][n] are 1111111; the sense data SD[m][1] to SD[m][n] read by the sensor 220 are 1111111; and latched data LD[m][1] to LD[m][n] output by the data latch 230 after latching the sense data SD[m][1] to SD[m][n] are 1111111. At a timing 620, the write data of 1010110 are input for the first time; the fuse voltages VP[m][1] to VP[m][n] are 1010110 at the time; and the sense data SD[m][1] to SD[m][n] read by the sensor 220 changes from 1111111 to 1010110. Then, the clock signal CLK[m] provides corresponding pulses such as the pulse signals CLK[m][1] to CLK[m][7] of FIG. 5B such that the corresponding efuses 120[m][1] to 120[m][n] are burned. At the time, the latched data LD[m][1] to LD[m][n] are 1111111 and remain 1111111. At a timing 630, the write data of 1000110 is input for the second time. Since the determination circuit 240 already determines that the at least one efuse in the efuses 120[m][1] to 120[m][n] is burned, the detection signal DT[m] provided by the determination circuit 240 is at high logic level and the clock signal CLK[m] provided by the burn clock generator 320 is at low logic level such that the overwrite operation of the burn selector 330 on the efuses 120[m][1] to 120[m][n] is disabled. Therefore, the fuse voltages VP[m][1] to VP[m][n] remain 1010110; the sense data SD[m][1] to SD[m][n] read by the sensor 220 remain 1010110; and the latched data LD[m][1] to LD[m][n]

are 1111111 and remain 1111111. In this embodiment, the problem in the conventional art regarding reliability degradation of the burn operation performed on the efuses caused by temporary data only updated when the power is turned on and off and the overwrite operation performed on the efuse set 120[m] having the burned efuse between each power on and off may be overcame.

Figure 7:
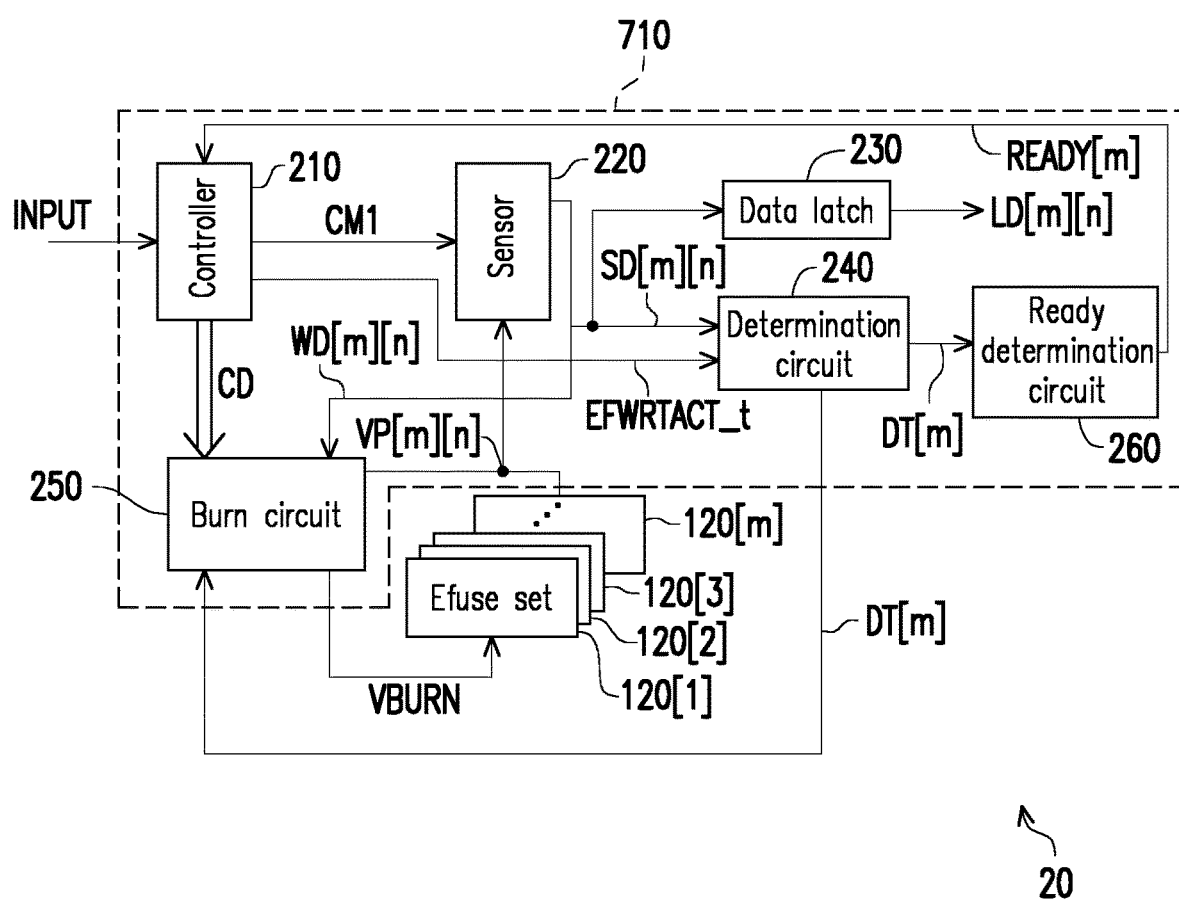
FIG. 7 is a schematic diagram of an efuse circuit in another embodiment of the invention.

Referring to FIG. 7, as compared to FIG. 2, a control circuit 710 in an efuse circuit 20 of FIG. 7 further includes a ready determination circuit 260. For other circuit parts, reference may be made to related description in FIG. 2, which is not repeated hereinafter. In another embodiment, the ready determination circuit 260 is coupled between the determination circuit 240 and the controller 210. The ready determination circuit 260 receives the detection signal DT[m], and generates a ready determination signal READY[m] according to the detection signal DT[m]. The ready determination circuit 260 outputs the determination signal READY[m] to the controller 210. In another embodiment, the ready determination circuit 260 includes a timer circuit (not illustrated), and the timer circuit may dynamically adjust a wait time according to the detection signal DT[m] to wait for the burn enable signal BURNEN and the burn voltage BURN to recover to preset voltage values. Specifically, the burn enable signal BURNEN will recover to a value greater than a first preset voltage value and the burn voltage BURN will recover to a value less than a second preset voltage value. The first preset voltage value and the second preset voltage value may be determined based on design requirements, and the invention is not limited thereto. The wait time is an interval time between the pulse signal corresponding to a current efuse and the pulse signal corresponding to a next efuse in the ready determination signal READY[m], and will be described in more detail below.

Figure 8:
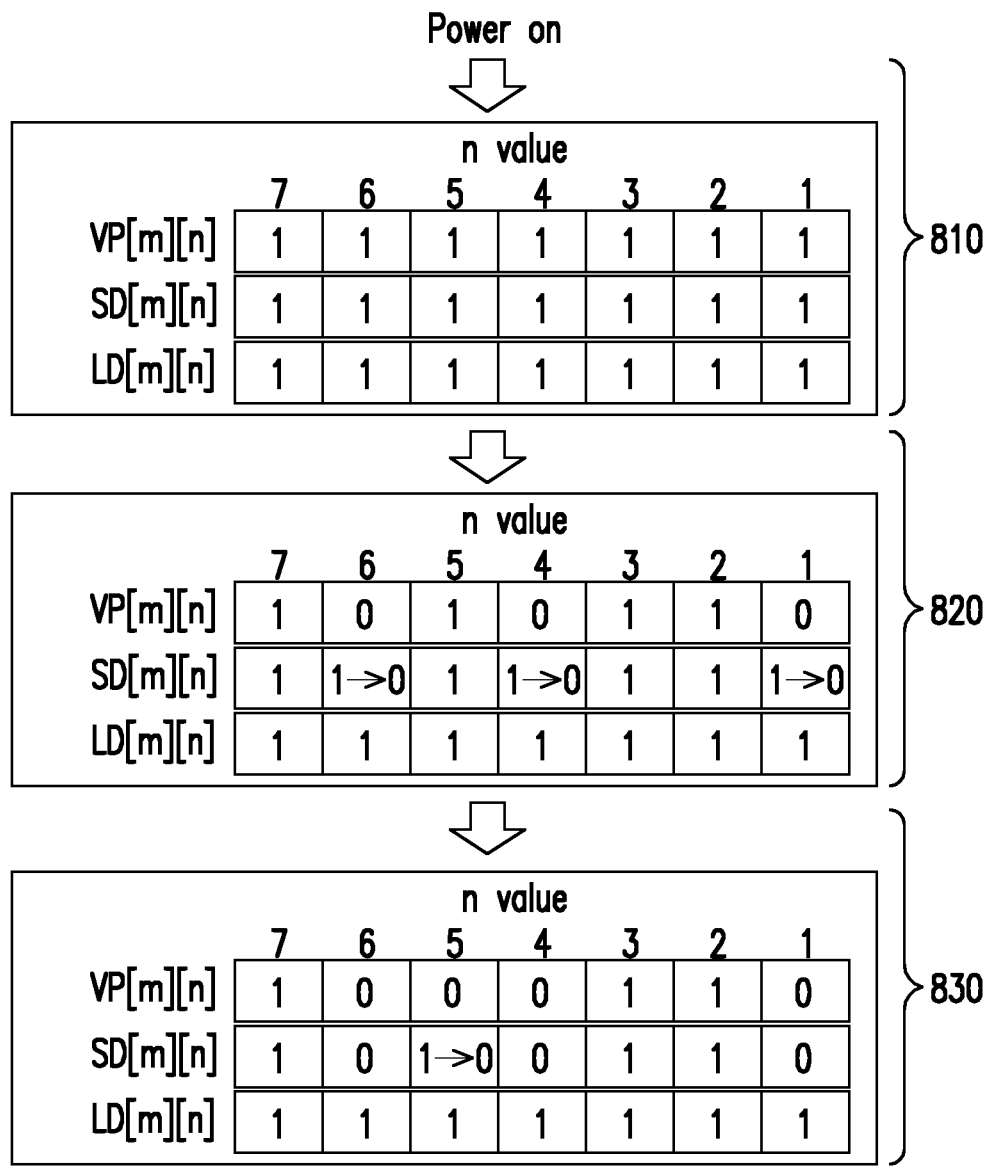
FIG. 8 is a transition diagram of efuse related values in another embodiment of the invention.

Referring to FIG. 8, FIG. 8 is similar to FIG. 6, and includes a timing 810 corresponding to the timing 610 and a timing 820 corresponding to the timing 620. Their only difference is that in another embodiment, at a timing 830, when the write data 1000110 is input for the second time, the overwrite operation is allowed such that the fuse voltages VP[m][1] to VP[m][n] become 1000110; the sense data SD[m][1] to SD[m][n] read by the sensor 220 become 100011; and the latched data LD[m][1] to LD[m][n] remain 1111111. Specifically, in another embodiment, the efuse circuit 20 further includes the ready determination circuit 260, and the timer circuit in the ready determination circuit 260 may dynamically adjust the wait time to wait for the burn enable signal BURNEN and the burn voltage BURN to recover to the preset voltage values. For example, because extending the wait time will increase the reliability of the next overwrite operation, the overwrite operation will be allowed without being disabled.

Figure 9:
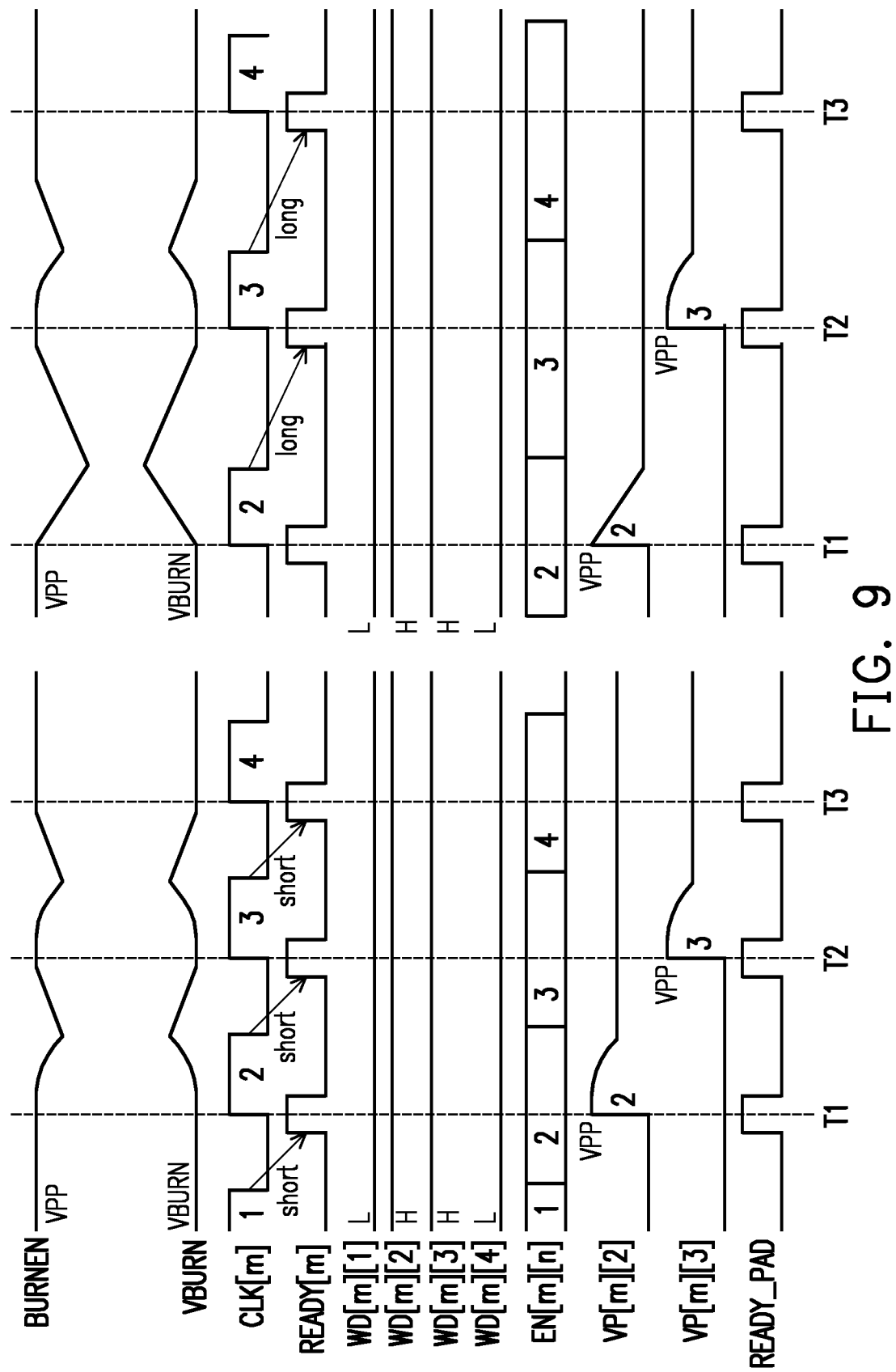
FIG. 9 is a timing diagram of a burn operation on the efuses in another embodiment of the invention.

Referring to FIG. 9, the left diagram shows the efuse 120[m][2] that is not burned, and the right diagram shows the efuse 120[m][2] that is burned. In another embodiment, the efuse circuit 20 further includes the ready determination circuit 260, and the ready determination circuit 260 is configured to generate a ready determination signal READY. Before the efuse set 120[m] is burned, the wait time is relatively short. A time interval between a time point T1 and a time point T2 and a time interval between the time point T2 and a time point T3 in the left diagram are shorter than those in the right diagram of FIG. 9. On the other hand, when the efuse set 120[m] is burned, a voltage drop of the burn enable signal BURNEN with respect to the power voltage VPP and a voltage drop of the burn voltage VBURN with respect to the burn voltage VBURN in the right diagram are larger than those in the left diagram of FIG. 9, and thus a longer waiting time is required to wait for the voltages to recover. Accordingly, the ready determination circuit 260 may extend the wait time, and the wait time is a time interval between the pulses in the ready determination signal READY. As shown by the right diagram in FIG. 9, the time interval between the time point T1 and the time point T2 and the time interval between the time point T2 and the time point T3 in the right diagram are longer than those in the left diagram of FIG. 9. In this example, the write data WD[m][1] is at low logic level; the write data WD[m][2] is at high logic level; the write data WD[m][3] is at high logic level; and the write data WD[m][4] is at low logic level. The fuse voltage VP[m][2] is pulled up to the power voltage VPP at the time point T1, and the fuse voltage VP[m][3] is pulled up to the power voltage VPP at the time point T2.

It is worth noting that, when the user knows whether the efuse is burned, the user can adjust the wait time according to the current situation. If the user does not know whether the efuse is burned, a countermeasure A and a countermeasure B are correspondingly provided as follows. In the countermeasure A, a time point at which the next pulse is to be input may be learnt by a timing of a pad output ready determination signal READY_PAD. Here, the pad output ready determination signal READY_PAD is a signal formed by the ready determination signal READY output by a pad. The pad may be selected from the existing output pads DQ and DQS, and the invention is not limited thereto. In the countermeasure B, a larger number of clocks than the number of efuses 120[m][n] are provided. When the wait time is not long enough, the pulses in the clock signal CLK[m] may be omitted. Therefore, the present embodiment can solve the problem regarding processing speed (throughput) degradation of the efuses in the conventional art caused by increasing the wait time for the burn enable signal BURNEN and the VBURN to recover to preset voltage thresholds.

Furthermore, when determining that the at least one efuse in the efuses 120[m][1] to 120[m][n] is the burned efuse according to the detection signal DT[m], the ready determination circuit 260 adjusts the wait time of each of the efuses 120[m][1] to 120[m][n] in the efuse set 120[m] to which the at least one efuse belongs to a first wait time. When determining that the efuses are the not-burned efuses according to the detection signal DT[m], the ready determination circuit 260 adjusts the wait time of each of the efuses 120[m][1] to 120[m][n] in the efuse sets 120[m] to which each of the efuses 120[m][1] to 120[m][n] belongs to a second wait time. In this embodiment, the first wait time is greater than the second wait time.

Figure 10:
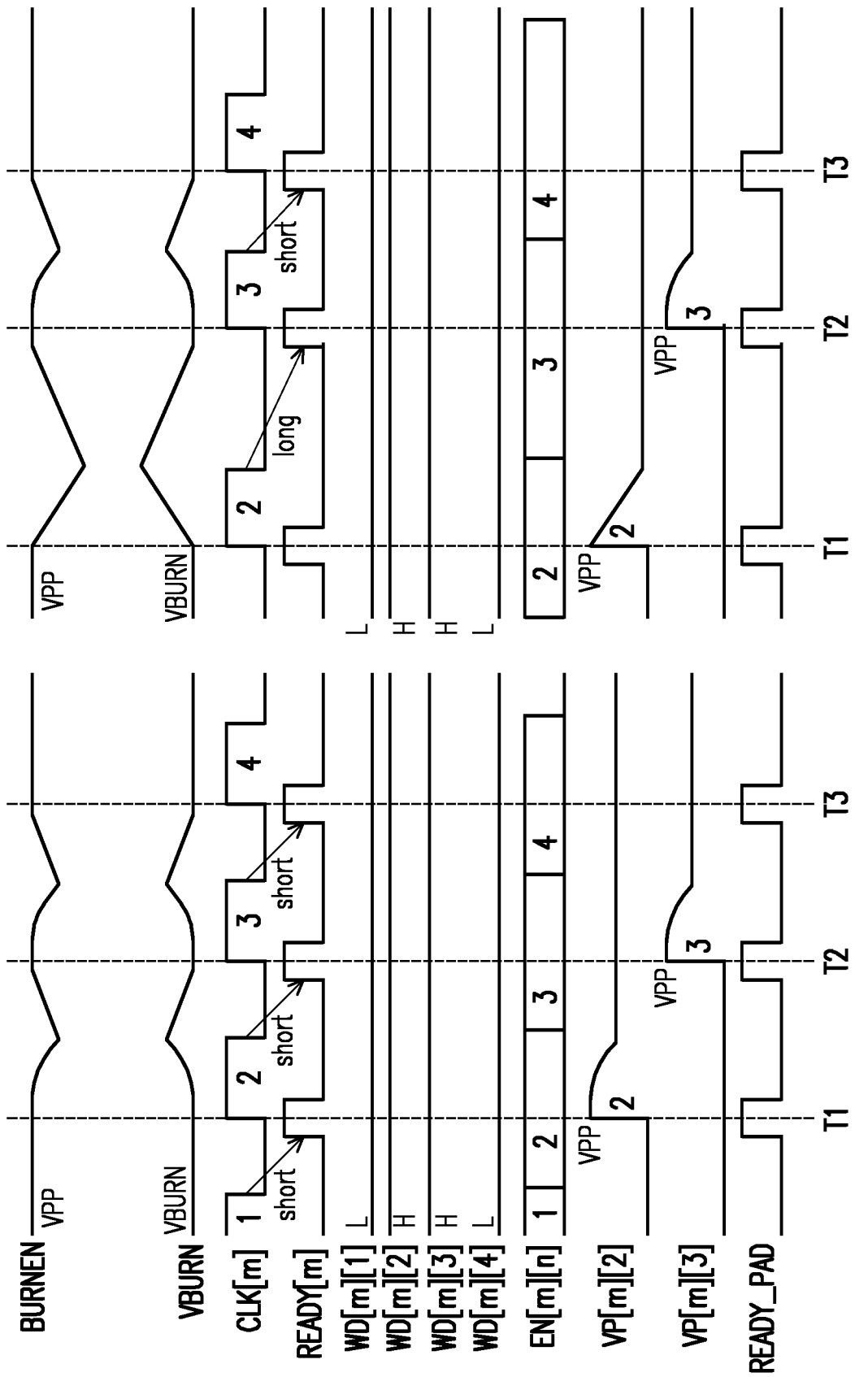
FIG. 10 is a timing diagram of a burn operation on the efuses in yet another embodiment of the invention.

Referring to FIG. 10, FIG. 10 is similar to FIG. 9 but differs in that the wait times of the entire efuse set 120[m] are not adjusted synchronously in the embodiment of FIG. 10. Instead, the wait times are dynamically adjusted according to the detection signal DT[m] for each efuse 120[m][n]. For instance, in the right diagram of FIG. 10, since the voltage drops of the burn enable signal BURNEN and the burn voltage VBURN are larger between the time point T1 and the time point T2, the ready determination circuit 260 may adjust the wait time between the time point T1 and the time point T2 to be longer so that the fuse voltage VP[m][2] has a longer voltage recovery time. Since the voltage drops of the burn enable signal BURNEN and the burn voltage VBURN are smaller between the time point T2 and the time point T3, the ready determination circuit 260 may adjust the wait time between the time point T2 and the time point T3 to be shorter so that the fuse voltage VP[m][3] has a shorter voltage recovery time. In this embodiment, the burn operation of the efuse 120[m][n] can have a higher processing speed by changing the wait time for each efuse.

More specifically, when determining that a first efuse in the efuses 120[m][n] is the burned efuse according to the detection signal DT[m], the ready determination circuit 260 adjusts the wait time corresponding to the first efuse to the first wait time. When determining that a second efuse in the efuses 120[m] is the not-burned efuse according to the detection signal DT[m], the ready determination circuit 260 adjusts the wait time corresponding to the second efuse to the second wait time. In this embodiment, the second wait time is greater than the first wait time.

Figure 11:
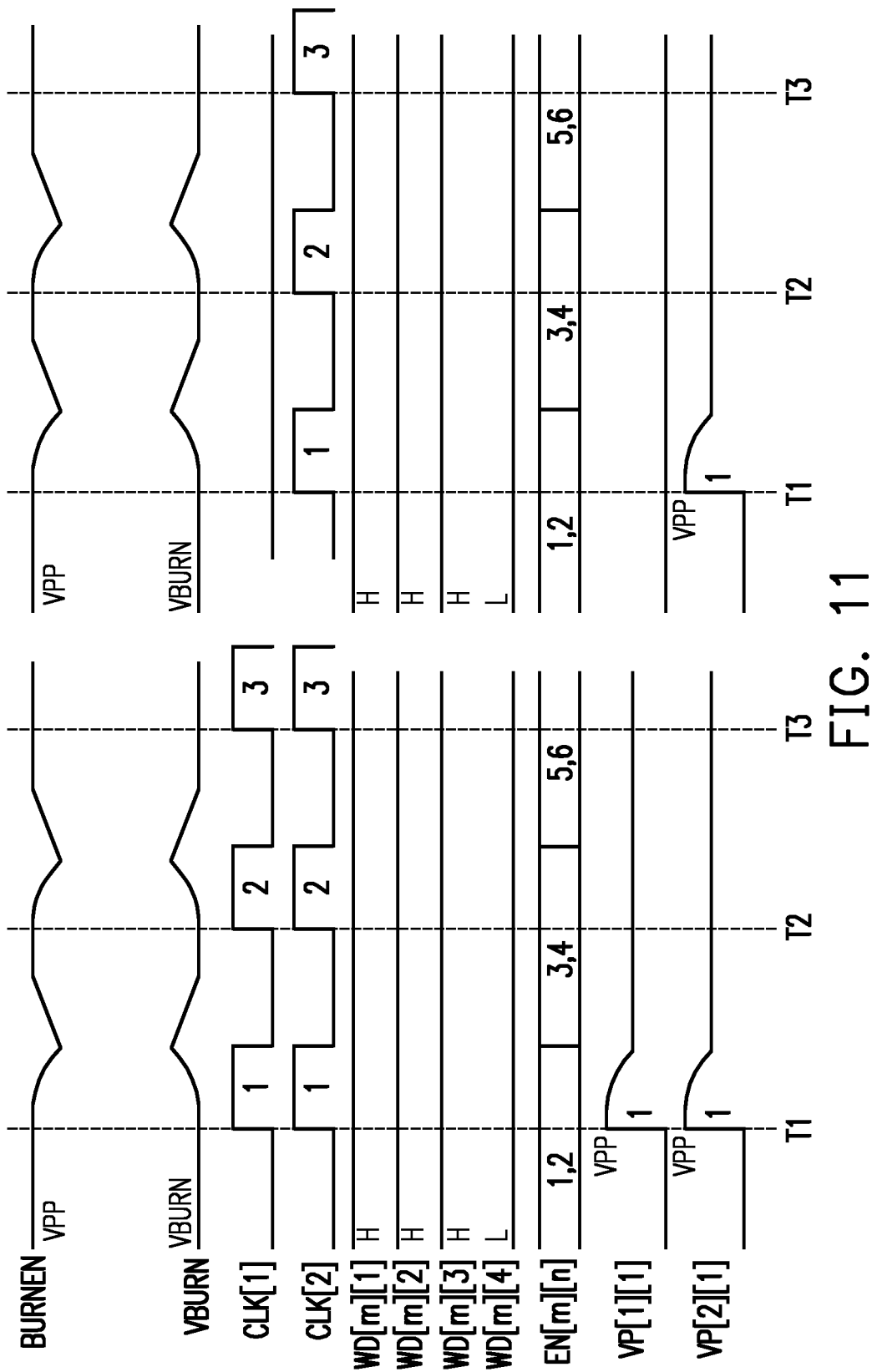
FIG. 11 is a timing diagram of a burn operation on the efuses in still another embodiment of the invention.

Referring to FIG. 11, in this embodiment, when the burn operation is to be performed on the efuse sets 120 [1] to 120 [m] at the same time, the burn operation is disabled for the efuse set 120 [m] having the burned efuse and the burn operation is not disabled for the 120[m] not having the burned efuse. For instance, referring to the left diagram of FIG. 11, in the case where the efuse set 120[1] and the efuse set 120[2] are to be burned at the same time, when both the two efuse sets do have not the burned efuse, the two efuses will be burned at the same time. Specifically, at the time point T1, the pulse signal CLK[1] and the pulse signal CLK[2] are both enabled so that the fuse voltage VP[1][1] and the fuse voltage VP[2][1] are both pulled up the power voltage VPP. On the other hand, referring to the right diagram of FIG. 11, when the efuse set 120[1] has the burned efuse and the efuse set 120[2] does not have the burned efuse, the burn operation on the efuses of the efuse set 120[1] is disabled and only the burn operation on the efuse set 120[2] is enabled. Specifically, at the time point T1, the pulse signal CLK[1] is disabled and the pulse signal CLK[2] is enabled so that the fuse voltage VP[1][1] is maintained at low logic level and the fuse voltage VP[2][1] is pulled up the power voltage VPP. Therefore, this embodiment can solve the problem of reliability degradation caused by the two efuse sets being burned at the same time.

Figure 12:
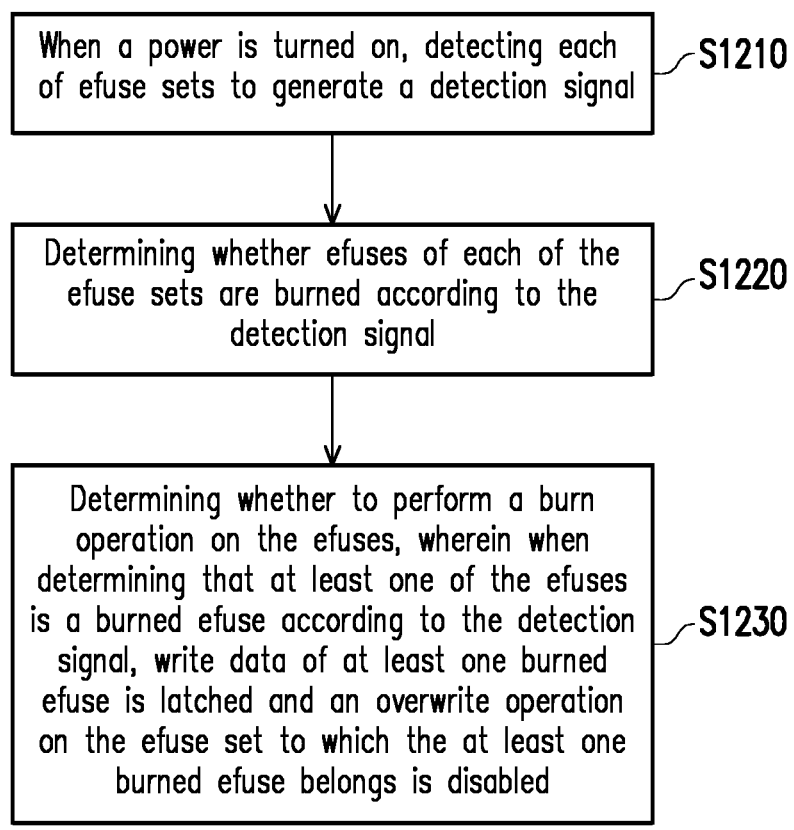
FIG. 12 is a flowchart of an operation method of the efuse circuit in an embodiment of the invention.

Referring to FIG. 12, in step S1210, when a power is turned on, the control circuit 110 detect each efuse set 120[m] to generate a detection signal DT[M][n]. Then, in step 1220, the control circuit 110 determines whether the efuses 120[m][1] to 120[m][n] in each efuse set 120[m] is burned according to the detection signal DT[m][n]. In step S1230, the control circuit 110 determines whether to perform a burn operation on the efuses 120[m][1] to 120[m][n], wherein when determining that at least one of the efuses 120[m][n] is the burned efuse according to the detection signal DT[m], the write data of the at least one burned efuse is latched and the overwrite operation on the efuse set 120[m] to which the at least one burned efuse belongs is disabled.

In summary, according to the embodiments of the invention, the efuse circuit and the operation method thereof are used to determine whether the efuse is burned without the use bit. When determining that the at least one of the plurality of efuses is the burned efuse, the control circuit latches the write data of the at least one burned efuse and disables the overwrite operation on the efuse set to which the at least one burned efuse belongs. As a result, not only may chip area be reduced, processing speed and reliability of the burn operation and reliability of the burn operation performed on the efuses may also be improved.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An efuse circuit adapted for a memory device, comprising:
    a plurality of efuse sets, each of the plurality of efuse sets having a plurality of efuses; and
    a control circuit, coupled to the plurality of efuse sets, wherein when a power is turned on, the control circuit detects each of the plurality of efuse sets to generate a detection signal, and determines whether the plurality of efuses of each of the plurality of efuse sets are burned according to the detection signal to determine whether to perform a burn operation on the plurality of efuses,
    wherein when determining that at least one efuse of the plurality of efuses is a burned efuse according to the detection signal, the control circuit disables an overwrite operation on the efuse set to which the at least one burned efuse belongs.

2. The efuse circuit according to claim 1, wherein when write data of the efuses are latched and a re-burn request is present during a period in which the power is turned on, the detection signal is updated according to the write data of each of the plurality of efuse sets, and whether each of the plurality of efuses of the plurality of efuse sets is burned is determined according to the detection signal.

3. The efuse circuit according to claim 1, wherein the step in which the control circuit detects each of the plurality of efuse sets to generate the detection signal, and determines whether the plurality of efuses are burned according to the detection signal comprise:
    detecting fuse voltages at first terminals of the plurality of efuses of each of the plurality of efuse sets and comparing the fuse voltages with a first threshold voltage to generate the detection signal by the control circuit, and determining whether the plurality of efuses are the burned efuse by a controller according to the detection signal.

4. The efuse circuit according to claim 1, wherein the control circuit comprises:
    a controller, receiving an input signal to generate a first control signal and control data;
    a sensor, coupled between the controller and first terminals of the plurality of efuses of each of the plurality of efuse sets, and configured to detect fuse voltages at the first terminals of the plurality of efuses of each of the plurality of efuse sets according to the first control signal to generate write data and sense data;
    a data latch, coupled to the sensor, and configured to latch the sense data to generate latched data and output the latched data to a control logic circuit of the memory device;
    a determination circuit, coupled to the sensor, and configured to determine whether the at least one efuse in the plurality of efuses of each of the plurality of efuse sets is the burned efuse according to the sense data to generate the detection signal; and
    a burn circuit, coupled to the controller, the plurality of efuses, the sensor and the determination circuit, and configured to output the fuse voltages to the first terminals of the plurality of efuses according to the control data, the write data and the detection signal and output a burn voltage to second terminals of the plurality of efuses.

5. The efuse circuit according to claim 4, wherein the burn circuit comprises:

a burn voltage generator, coupled between the controller and the plurality of efuse sets, and configured to generate a burn enable signal and the burn voltage according to a write enable signal in the control data and output the burn voltage to the second terminals of the plurality of efuses;

a burn clock generator, coupled to the controller and the determination circuit, and configured to generate a clock signal according to the detection signal and clock data in the control data; and a burn selector, coupled to the controller, the sensor, the burn voltage generator and the burn clock generator, and configured to generate the fuse voltages to the first terminals of the plurality of efuses of the plurality of efuse sets according to an enable signal in the control data, the write data, the burn enable signal, the burn voltage and the clock signal and perform the burn operation on the efuses requiring the burn operation according to the fuse voltages.

6. The efuse circuit according to claim 4, wherein the sensor comprises:

a first switch circuit, coupled between the controller and the first terminals of the plurality of efuses of each of the plurality of efuse sets, and configured to receive a first enable signal, a first switch signal, a second switch signal and the fuse voltages to generate a first voltage;

a sense amplification latch circuit, coupled to the first switch circuit, and configured to receive the first enable signal, a second enable signal, a third enable signal, the first voltage and a first latch voltage to generate a second latch voltage;

a second switch circuit, coupled to the sense amplification latch circuit, and configured to receive a second control signal and efuse address data to generate the first latch voltage and the second latch voltage; and a logic circuit, coupled to the sense amplification latch circuit and the second switch circuit, and configured to receive the second latch voltage to generate the sense data and the write data.

7. The efuse circuit according to claim 6, wherein the first switch circuit comprises:

a first P-type transistor, a first terminal of the first P-type transistor receiving a first enable signal, a control terminal of the first P-type transistor receiving the first switch signal, and a voltage of a second terminal of the first P-type transistor being the first voltage; and a first N-type transistor, a first terminal of the first N-type transistor coupled to the second terminal of the first P-type transistor, a control terminal of the first N-type transistor receiving the second switch signal, and a second terminal of the first N-type transistor receiving the fuse voltages, wherein the second switch circuit comprises:

a second N-type transistor, a first terminal of the second N-type transistor coupled to the sense amplification latch circuit, a control terminal of the second N-type transistor receiving the second control signal, a second terminal of the second N-type transistor receiving the efuse address data, wherein a voltage of the first terminal of the second N-type transistor being the first latch voltage;

a third N-type transistor, a first terminal of the third N-type transistor coupled to the sense amplification latch circuit, and a control terminal of the third N-type transistor receiving the second control signal; and a first inverse gate, coupled between a second terminal of the second N-type transistor and a second terminal of the third N-type transistor, configured to receive the efuse address data to generate an inversed efuse address data to the second terminal of the third N-type transistor, wherein the logic circuit comprises:

a first NAND gate, coupled to the first terminal of the third N-type transistor and the sense amplification latch circuit, configured to receive the second latch voltage and a third enable signal to generate the sense data;

a second NAND gate, coupled to the sense amplification latch circuit and the first terminal of the third N-type transistor, configured to receive the second latch voltage and a a first write enable signal to generate an inversed write data; and a second inverse gate, coupled to the second NAND gate, configured to receive the inversed write data to generate the write data.

8. The efuse circuit according to claim 4, wherein the determination circuit comprises:

a logic determination circuit, coupled to the sensor, and configured to receive the sense data and determine whether the at least one efuse in the plurality of efuses is the burned efuse according to the sense data to generate a determination signal;

a buffer circuit, coupled to the logic determination circuit, and configured to receive the determination circuit signal and generate a buffered determination signal; and a latch, coupled to the buffer circuit, and configured to receive the buffered determination signal to generate the detection signal.

9. The efuse circuit according to claim 8, wherein the logic determination circuit comprises:

a first NAND gate, configured to receive a first sub sense data of the sense data to generate a first NAND signal;

a second NAND gate, configured to receive a second sub sense data of the sense data to generate a second NAND signal;

a third NAND gate, configured to receive a third sub sense data of the sense data to generate a third NAND signal; and a first NOR gate, coupled to output terminals of the first NAND gate, the second NAND gate and the third NAND gate, configured to receive the first NAND signal, the second NAND signal and the third NAND signal to generate a determination signal.

10. The efuse circuit according to claim 8, wherein the buffer circuit comprises:

a third NAND gate, coupled to the logic determination circuit, configured to receive the determination signal to generate an inversed determination signal;

a fourth NAND gate, coupled to the third NAND gate, configured to receive the inversed determination signal to generate a buffered determination signal;

a second P-type transistor, coupled to the fourth NAND gate, a first terminal of the second P-type transistor receiving a power voltage, a control terminal of the second P-type transistor receiving a first write enable signal, and a second terminal of the second P-type transistor coupled to a power terminal of the fourth NAND gate; and a fourth N-type transistor, coupled to the fourth NAND gate, a first terminal of the fourth N-type transistor coupled to a ground terminal of the fourth NAND gate, a control terminal of the fourth N-type transistor receiving a second write enable signal, and a second terminal of the fourth N-type transistor coupled to a ground voltage.

11. The efuse circuit according to claim 4, wherein the control circuit further comprises:

a ready determination circuit, coupled between the determination circuit and the controller, and configured to generate a ready determination signal according to the detection signal and output the ready determination signal to the controller.

12. The efuse circuit according to claim 11, wherein the ready determination circuit comprises:

a timer circuit, configured to dynamically adjust a wait time according to the detection signal, the wait time being an interval time between a pulse signal corresponding to a current efuse and a pulse signal corresponding to a next efuse in the ready determination signal.

13. The efuse circuit according to claim 12, wherein when determining that the at least one efuse of the plurality of efuses is the burned efuse according to the detection signal, the ready determination circuit adjusts the wait time of each of the efuses in the efuse set to which the at least one efuse belongs to a first wait time; and when determining that the plurality of efuses are a not-burned efuse according to the detection signal, the ready determination circuit adjusts the wait time of each of the efuses in the efuse sets to which the plurality of efuses belong to a second wait time, wherein the first wait time is greater than the second wait time.

14. The efuse circuit according to claim 12, wherein when determining that a first efuse in the plurality of efuses is the burned efuse according to the detection signal, the ready determination circuit adjusts the wait time corresponding to the first efuse to the first wait time; and when determining that a second efuse in the plurality of efuses is the not-burned efuse according to the detection signal, the ready determination circuit adjusts the wait time corresponding to the second efuse to the second wait time, wherein the first wait time is greater than the second wait time.

15. The efuse circuit according to claim 1, wherein when the burn operation is to be performed on the plurality of efuse sets simultaneously, the burn operation on the efuse sets having the burned efuse is disabled, and the burn operation on the efuse sets not having the burned efuse is not disabled.

16. An operation method of an efuse circuit, the efuse circuit being adapted for a memory device, the efuse circuit comprising a plurality of efuse sets and a control circuit, each of the plurality of efuse sets having a plurality of efuses, the operation method comprising:

when a power is turned on, detecting each of the plurality of efuse sets to generate a detection signal;

determining whether the plurality of efuses of each of the plurality of efuse sets are burned according to the detection signal; and determining whether to perform a burn operation on the plurality of efuses, wherein when determining that at least one efuse of the plurality of efuses is a burned efuse according to the detection signal, an overwrite operation on the efuse set to which the at least one burned efuse belongs is disabled.

17. The operation method according to claim 16, wherein the steps of detecting each of the plurality of efuse sets to generate the detection signal and determining whether the plurality of efuses of each of the plurality of efuse sets are burned according to the detection signal comprise:

detecting fuse voltages at first terminals of the plurality of efuses of each of the plurality of efuse sets, comparing the fuse voltages with a first threshold voltage to generate the detection signal, and determining whether the plurality of efuses of each of the plurality of efuse sets are the burned efuse by a controller according to the detection signal.

18. The operation method according to claim 16, wherein when determining that the at least one efuse of the plurality of efuses is the burned efuse according to the detection signal, adjusting a wait time of each of the efuses in the efuse set to which the at least one of the plurality of efuses belongs to a first wait time; and when determining that the plurality of efuses are a not-burned efuse according to the detection signal, adjusting the wait time of each of the efuses in the efuse sets to which the plurality of efuses belong to a second wait time, wherein the first wait time is greater than the second wait time.

19. The operation method according to claim 16, wherein when determining that a first efuse in the plurality of efuses is the burned efuse according to the detection signal, adjusting the wait time corresponding to the first efuse to a first wait time; and when determining that a second efuse in the plurality of efuses is the not-burned efuse according to the detection signal, adjusting the wait time corresponding to the second efuse to a second wait time, wherein the first wait time is greater than the second wait time.

20. The operation method according to claim 16, wherein when the burn operation is to be performed on the plurality of efuse sets simultaneously, the burn operation on the efuse sets having the burned efuse is disabled, and the burn operation on the efuse sets not having the burned efuse is not disabled.

* * * * *